US 6,730,369 B1

(12) United States Patent
Amano (10) Patent No.: US 6,730,369 B1
(45) Date of Patent: May 4, 2004

(54) DEVICE AND METHOD FOR PLASMA PROCESSING (75) Inventor: Hideaki Amano, Zama (JP)

(73) Assignee: Tokyo Electron Limited, Tokyo-To (JP)

( * ) Notice: Subject to any disclaimer, the term of this patent is extended or adjusted under 35 U.S.C. 154(b) by 81 days.

(21) Appl. No.: 09/657,050

(22) Filed: Sep. 7, 2000

Related U.S. Application Data (63) Continuation of application No. PCT/JP99/03442, filed on Jun. 28, 1999.

(30) Foreign Application Priority Data

Jun. 30, 1998 (JP) .............................. 10-201286

(51) Int. Cl.⁷ ........................ H05H 1/46; C23C 16/511
(52) U.S. Cl. .............................. 427/575; 118/723 MW; 118/719; 216/69
(58) Field of Search ...................... 427/575; 216/67, 216/69, 70; 118/723 MW, 723 MA, 719

(56) References Cited

U.S. PATENT DOCUMENTS

| 5,292,393 | A | * | 3/1994 | Maydan et al. ........... 118/723 E |
| 5,320,707 | A | * | 6/1994 | Kanekiyo et al. |
| 5,403,436 | A | * | 4/1995 | Fujimura et al. ............ 427/575 |
| 5,508,066 | A | * | 4/1996 | Akahori ....................... 427/575 |
| 5,554,249 | A | * | 9/1996 | Hasegawa et al. ... 118/723 MA |
| 5,976,259 | A | * | 11/1999 | Yamazaki ............ 118/723 MW |
| 6,177,129 | B1 | * | 1/2001 | Wagner et al. ...... 118/723 MW |
| 6,306,765 | B1 | * | 10/2001 | Sato ............................ 427/575 |
| 6,360,687 | B1 | * | 3/2002 | Yanagisawa et al. ................... 118/723 MW |
| 6,372,084 | B2 | * | 4/2002 | Hongo et al. ........ 118/723 MW |
| 6,413,320 | B2 | * | 7/2002 | Maher et al. ................ 118/719 |
| 2002/0061248 | A1 | * | 5/2002 | Tepman ....................... 118/719 |
| 2002/0084032 | A1 | * | 7/2002 | Jeng et al. ................... 118/719 |

FOREIGN PATENT DOCUMENTS

| JP | 9-82493 | 3/1997 |
| JP | 9-143674 | 6/1997 |

OTHER PUBLICATIONS

Edward Purcell, *Electricity and Magnetism, Berkeley Physic Course*–vol. 2, McGraw'–Hill Book Company, New York, excerpts p. 16–29,190–193&198–219, 1965 no month.*

* cited by examiner

Primary Examiner—Marianne Padgett
(74) Attorney, Agent, or Firm—Finnegan, Henderson, Farabow, Garrett & Dunner LLP (57) ABSTRACT

The vacuum processing chambers 31 of the plasma processing units 3A and 3B are connected to the transfer chamber 2 and the wafer W in the positioned state is transferred from the transfer chamber 2 to the mounting stages 4 in the vacuum processing chambers 31. The volume and length of the wave guide 5 are the same between the plasma processing units 3A and 3B. The location relationship of the wave guide 5 to the transfer directions M1 and M2 of the transfer arm 61 is the same between the plasma processing units 3A and 3B. As a result, the location relationship of the wave guide 5 to the wafer W mounted on the mounting stage 4 in a predetermined direction is the same between the plasma processing units 3A and 3B.

8 Claims, 6 Drawing Sheets

DEVICE AND METHOD FOR PLASMA PROCESSING

This application is a continuation of PCT/JP99/03442 filed Jun. 28, 1999

BACKGROUND OF THE INVENTION

1. Field of the Invention

The present invention relates to a plasma processing apparatus and a plasma processing method for generating plasma using electron cyclotron resonance (ECR) by a microwave and a magnetic field and processing a substrate, for example, a semiconductor wafer on the basis of the plasma.

2. Description of the Related Art

A plasma processing apparatus using ECR generates microwave of, for example, 2.45 GHz into a vacuum plasma processing chamber via a wave guide, at the same time, applies a magnetic field of, for example, 875 gauss by, for example, an electromagnetic coil, converts plasma generation gas to high-concentration plasma by the mutual action (resonance) of the microwave and magnetic field, and performs the film depositing process and etching process on the basis of this plasma.

Figure 6:
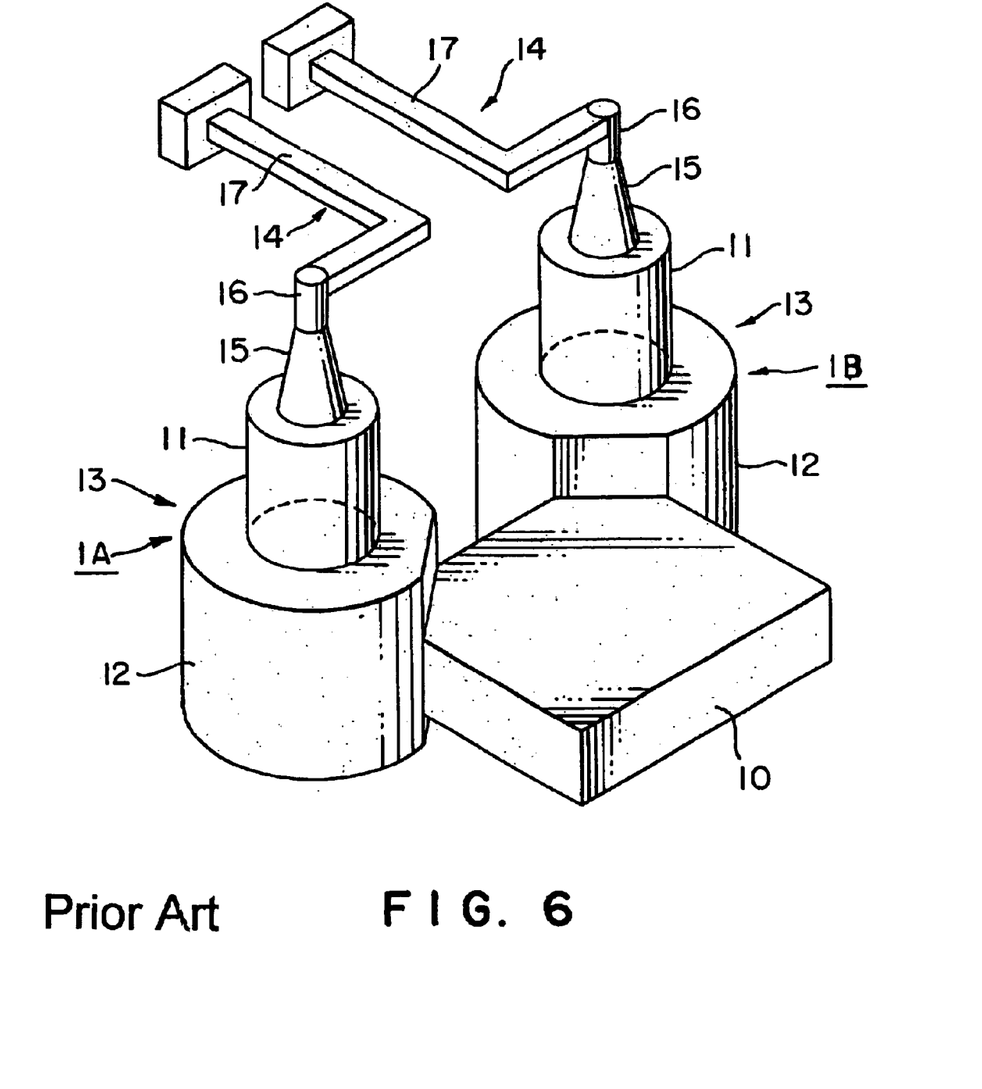
FIG. 6 is a schematic view showing a conventional plasma processing apparatus.

On the other hand, from the requests of footprint reduction and cut-down of cost, an apparatus for airtightly connecting a plurality of plasma processing units to a common transfer chamber and accessing each plasma processing unit by a transfer arm in the transfer chamber has been developed. FIG. 6 shows an appearance of such a kind of apparatus. In this specification, plasma processing units 1A and 1B connected to a transfer chamber 10 are called plasma processing units and the whole is called a plasma processing apparatus.

Each of the plasma processing units 1A and 1B has a vacuum processing chamber 13 including a first vacuum chamber 11 composed of a small-diameter cylinder and a second vacuum chamber 12 composed of a large-diameter cylinder, a wave guide 14 which is connected to the top of the first vacuum chamber 11 via a microwave transmission window not shown in the drawing and leading a microwave into the vacuum processing chamber 13, for example, in the TM mode, and a microwave generator 14a installed at the base end of the wave guide 14. A wafer W transferred onto a mounting stage not shown in the drawing in the second vacuum chamber 12 from the transfer chamber 10 is processed by plasma.

Figure 7:
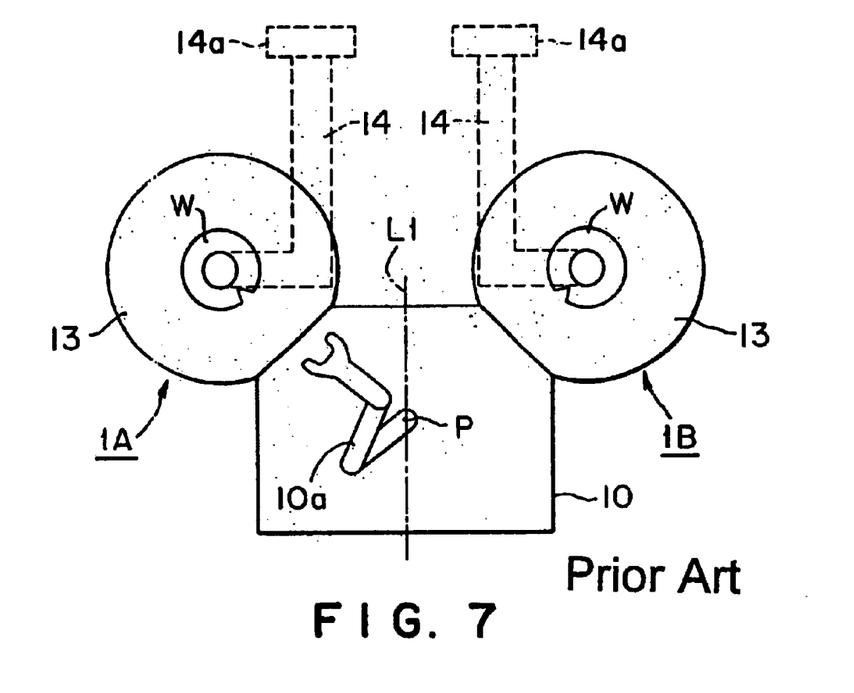
FIG. 7 is a schematic plan view showing a plane layout of a conventional plasma processing apparatus.

The wave guide 14 is composed of a conical wave guide positioned above the first vacuum chamber 11 which is widen toward the end, a cylindrical wave guide 16 connected on the conical wave guide 15, and a rectangular wave guide 17 connected perpendicularly to the side of the cylindrical wave guide 16. FIG. 7 is a schematic plan view showing the location relationship between the wafer W on the mounting stage and the rectangular wave guide 17 when the plasma processing apparatus shown in FIG. 6 is viewed from the top. The wave guide 14 and the microwave generator 14a are indicated by dotted lines. As shown in FIGS. 6 and 7, both of the rectangular wave guide 17 of the plasma processing unit 1A and the rectangular wave guide 17 of the plasma processing unit 1B are hook-shaped and arranged symmetrically right and left, that is, symmetrically about the center axis line of the transfer chamber 10 in the horizontal direction. In FIG. 7, numeral 10a indicates a transfer arm, which transfers, for example, the wafer W positioned outside the transfer chamber 10 to the mounting stages of the plasma processing units 1A and 1B.

In the aforementioned apparatus, since the wafer W is positioned, in both plasma processing units 1A and 1B, for example, the V-shaped notch for positioning the wafer W is directed toward the rotational center P of the transfer arm 10a. On the other hand, the rectangular wave guides 17 of the plasma processing units 1A and 1B are positioned symmetrically right and left, so that the positions of the rectangular wave guides 17 for the direction of the wafer W are different from each other.

Figure 8:
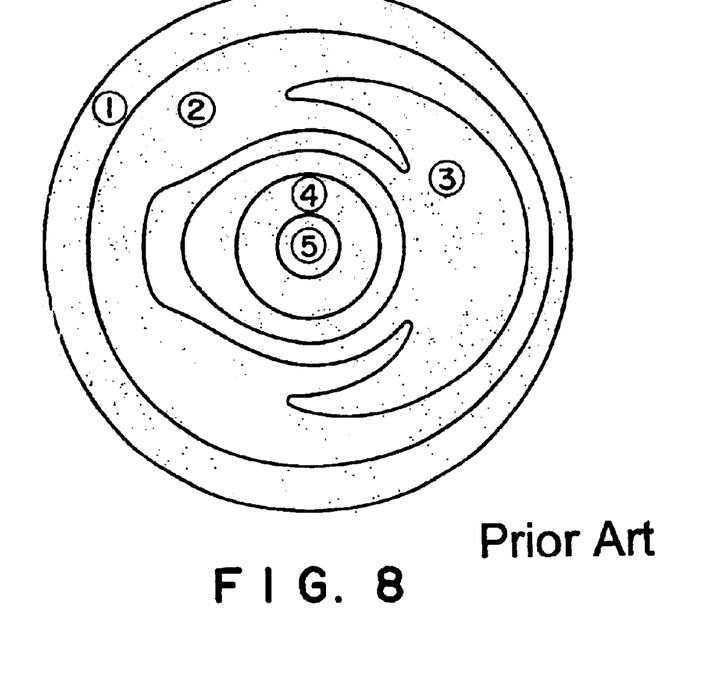
FIG. 8 is an illustration showing the condition that the electric field intensity distribution is deviated from a concentric circle.

A microwave is propagated through the rectangular wave guide 17 in the TE mode and the TE mode is converted to the TM mode at the connector with the cylindrical wave guide 16. In the cylindrical wave guide 16, the electric field intensity distribution should be originally concentrically (the direction of the electric field is the direction of the diameter). However, the distribution is actually one-sided. FIG. 8 is a drawing for showing this situation schematically and the numbers (1) to (5) stated in the drawing indicate the intensity of each of the divided areas. A smaller number among the numbers (1) to (5) indicates weaker intensity of the electric field.

As the microwave moves toward the mounting stage, the degree of deviation of the electric field is reduced. However, in a state that there is a deviation of the electric field at the ECR point where ECR is generated, high-concentration plasma is generated, so that the plasma concentration distribution (concentration distribution of ions and electrons) is also deviated from the concentric state. Therefore, viewed from the wafer W, the degree of deviation of the plasma concentration is different between the plasma processing units 1A and 1B, so that the processing condition in the surface of the wafer W is different between them. For example, when the film forming process is performed, the film thickness distribution is different and for example, when the etching process is performed, variations in the degree of grooving are different.

As mentioned above, when the effect of deviation of a microwave in the TM mode, that is, the effect of the electric field intensity distribution is different between the plasma processing units 1A and 1B and as a result, there is a difference in the processing condition of the wafer W, for example, when the processing condition is bad, the analysis of the cause and subsequent adjustment and improvement are complicated and hard to be carried out and the management of each unit is difficult.

SUMMARY OF THE INVENTION

The present invention was developed with the foregoing in view and is intended to provide an apparatus and method for eliminating differences in the processing condition of a substrate between the plasma processing units.

The present invention provides a plasma processing apparatus comprising: a plurality of plasma processing units, each having a vacuum processing chamber including a mounting stage for mounting a substrate with a reference point and a wave guide for introducing high frequency waves into this vacuum processing chamber for converting process gas to plasma by high frequency waves and processing the substrate by the plasma; and a common transfer chamber which is airtightly connected to these plurality of plasma processing units and includes a transfer arm for transferring the substrate to the mounting stage in the fixed transfer direction and in a state that the reference point of the substrate is positioned with respect to the transfer arm, wherein between the plasma processing units, the location relationship of the wave guide to the transfer direction of the transfer arm is the same.

The process to be performed for the substrate is, for example, the film forming process and etching process.

According to the present invention, the reference point of the substrate is positioned against the transfer arm and the location of each wave guide of each plasma unit in relation to the transfer direction of the transfer arm is the same for each plasma processing apparatus, so that the location of the wave guide relative to the reference point of the substrate is the same between the plasma processing units. Therefore, even if the electric field intensity distribution of high frequency waves introduced from the wave guide is deviated and the plasma concentration on the basis of it is not uniform, there is no difference in the effect of the deviation of the electric field intensity distribution for the substrate between the plasma processing units. Therefore, analysis of the processing condition and improvement of the apparatus can be easily carried out.

The present invention provides a plasma processing method for performing a predetermined process for a substrate by a plasma processing apparatus comprising a plurality of plasma processing units, each having a vacuum processing chamber including a mounting stage for mounting a substrate with a reference point and a wave guide for introducing high frequency waves into this vacuum processing chamber for converting process gas to plasma by high frequency waves and processing the substrate by the plasma and a common transfer chamber which is airtightly connected to these plurality of plasma processing units and includes a transfer arm for transferring the substrate to the mounting stage in the fixed transfer direction comprises the steps of: transferring the substrate with a reference point to the mounting stages of the plasma processing units from the transfer chamber and making the location relationship between the reference point of the substrate to be mounted on the mounting stage to the wave guide equal between the plasma processing units and, performing the plasma process for the substrate in a state that the location relationship of the reference value of the substrate to be mounted on the mounting stage to the wave guide is kept the same between the plasma processing units.

DESCRIPTION OF THE PREFERRED EMBODIMENTS

Figure 1:
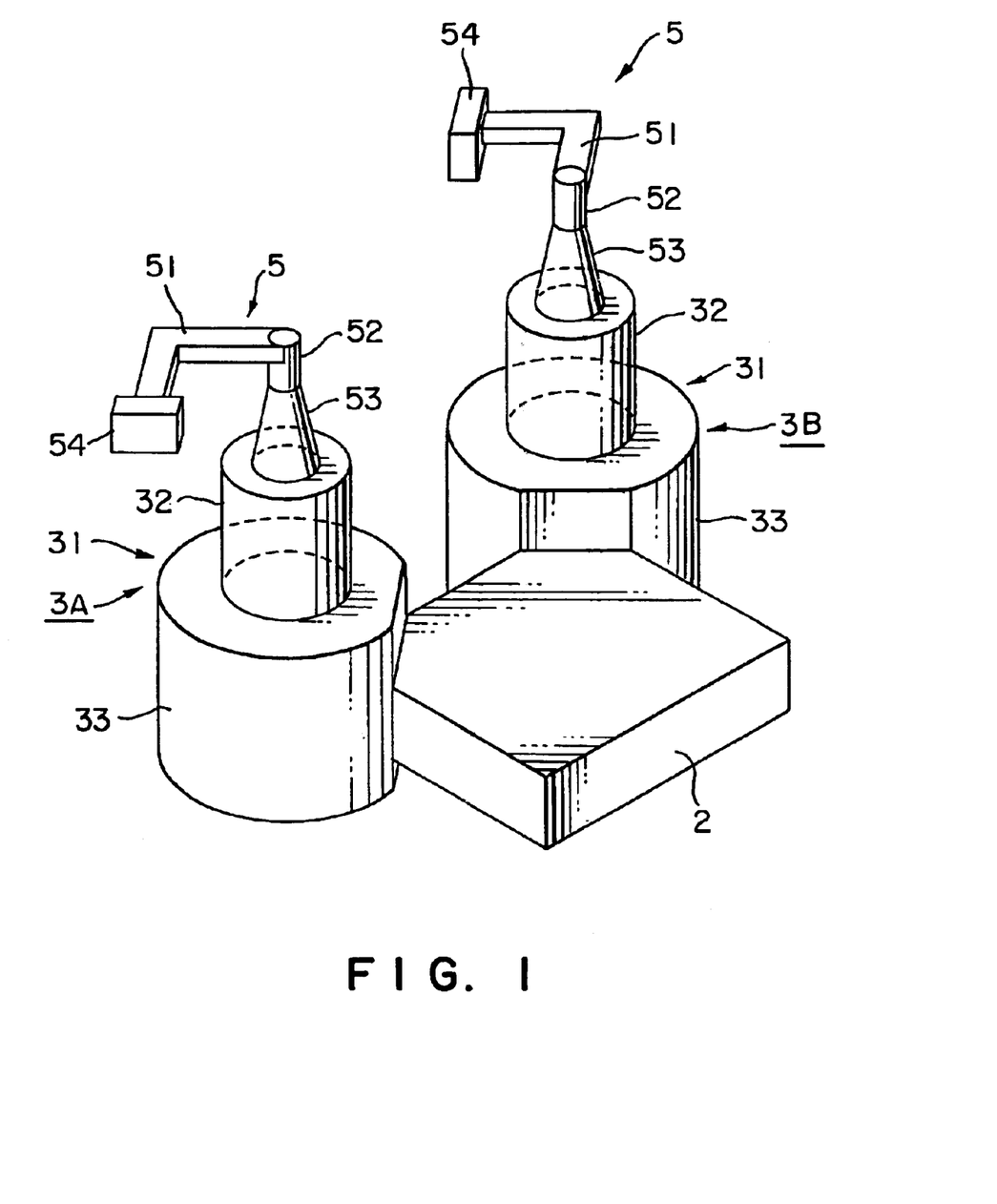
FIG. 1 is a schematic view showing a plasma processing apparatus relating to the embodiment of the present invention.

FIG. 1 is a schematic view showing the whole constitution of a plasma processing apparatus relating to the embodiment of the present invention. The plasma processing apparatus has a transfer chamber 2 which is a vacuum container, and a plurality of, for example, two plasma processing units 3A and 3B having the same structure which are airtightly connected to the transfer chamber 2.

Figure 2:
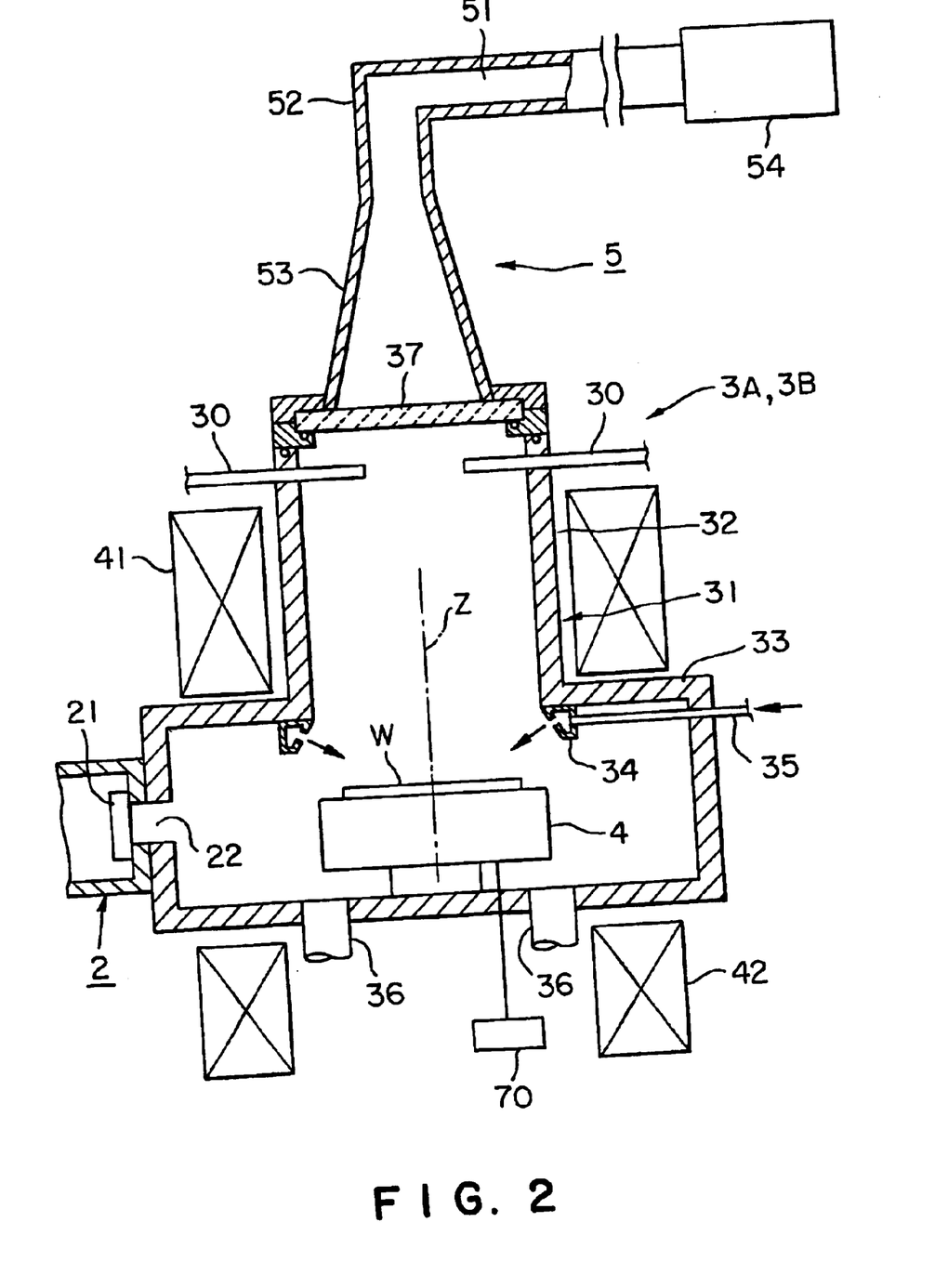
FIG. 2 is a cross sectional view showing plasma processing units which are a part of a plasma processing apparatus.

The structures of the plasma processing units 3A and 3B will be explained by referring to FIG. 2. In FIG. 2, numeral 31 indicates a vacuum processing chamber and the vacuum processing chamber 31 has a first cylindrical vacuum chamber 32 with a small diameter and a second cylindrical vacuum chamber 33 with a large diameter. In the first vacuum chamber 32, plasma gas nozzles 30 equally arranged in the peripheral direction are projected and installed. In the second vacuum chamber 33, a ring-shaped gas feed unit 34 is installed and film forming gas introduced from a gas feed tube 35 is fed into the vacuum processing chamber 31 from the gas feed unit 34.

In the second vacuum chamber 33, a mounting stage 4 for mounting a semiconductor wafer W (a substrate) is installed. A high frequency power source 70 is connected to the mounting stage 4 so as to apply a bias voltage for pulling in ions to the wafer W. In the side wall of the second vacuum chamber 33, a transfer port 22 to be opened and closed by a gate valve 21 is formed and the second vacuum chamber 33 is airtightly connected to the transfer chamber 2 via the transfer port 22. Numeral 36 indicates an exhaust tube.

A main electromagnetic coil 41 and ran auxiliary electromagnetic coil 41 are respectively installed around the first vacuum chamber 32 and under the second vacuum chamber 33 as magnetic field forming means, and a flow of magnetic flux in a predetermined shape is formed in the vacuum processing chamber 31 by these electromagnetic coils 41 and 42, and a magnetic field of 875 gauss is formed at the ECR point.

Figure 3:
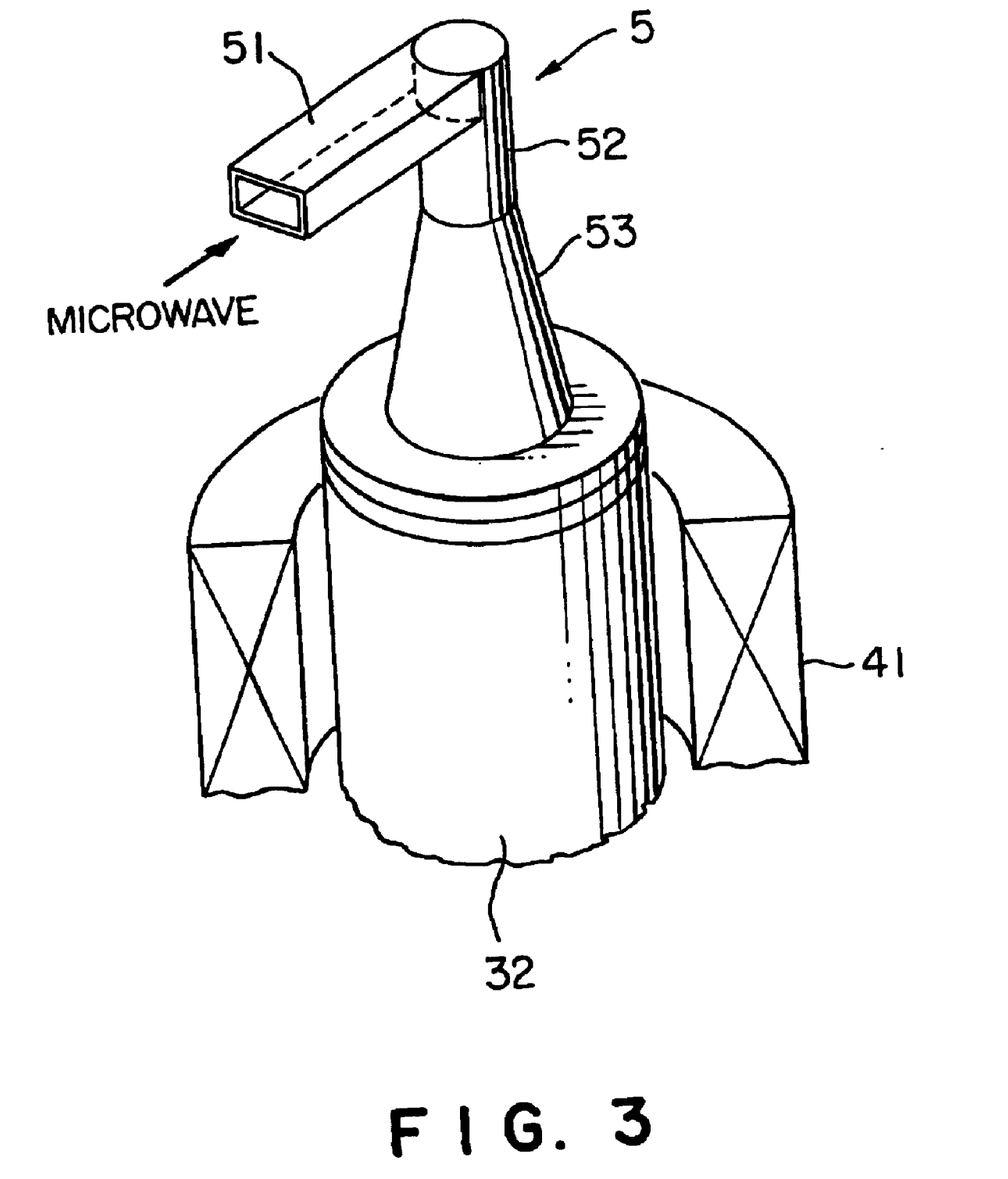
FIG. 3 is a perspective view showing a wave guide of a plasma processing unit.

On the other hand, the upper end surface of the vacuum processing chamber 31 is composed of a transmission window 37 composed of a circular dielectric for transmitting a microwave. A wave guide 5 for supplying a microwave of, for example, 2.45 GHz in the TM mode, for example, TM mode is installed on the to of the transmission window 37. The wave guide 5, as shown in FIGS. 2 and 3, is structured so that the end of the outlet side of a rectangular wave guide 51 is bent downwardly at right angle and connected to the upper side of a cylindrical wave guide 52 and the outlet side (lower end) of the cylindrical wave guide 52 is connected to the inlet side (upper end) of a conical wave guide 53 which widens toward the lower side. The connection portion of the rectangular wave guide 51 and the cylindrical wave guide 52 is a TM mode converter. The inlet side of the rectangular wave guide 51 is connected to a microwave generator 54 which is a high frequency power source and on the other hand, the outlet side (lower side) of the conical wave guide 53 is connected to the top of the transmission window 37. FIG. 3 is a perspective view showing a part of the wave guide 5.

Figure 4:
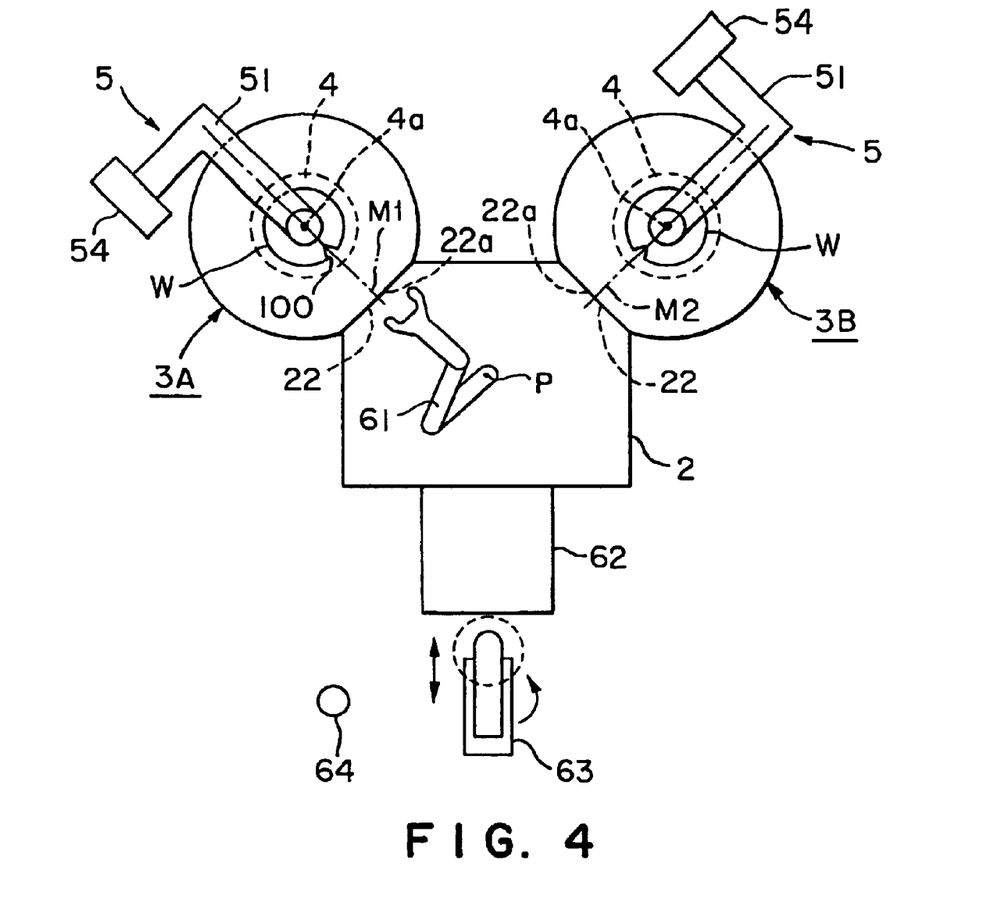
FIG. 4 is a schematic plan view showing a plane layout of the aforementioned plasma processing apparatus.
Figure 5:
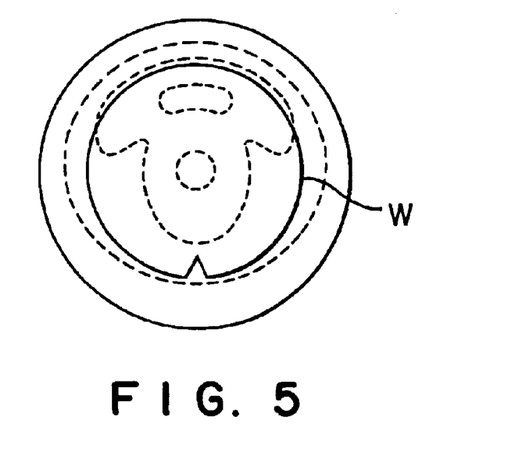
FIG. 5 is an illustration showing the electric field intensity distribution and wafer position in correspondence with each other.

A characteristic of this embodiment is that in both the plasma processing units 3A and 3B, the wave guide 5 has the same structure, that is, the volume and length of the wave guide 5 are the same and the location of the wave guide 5 relative to the wafer W mounted on the mounting stage 4 in a predetermined direction is the same. Namely, the volume and height of the cylindrical wave guide 52 and the conical wave guide 53 are the same in either of the plasma processing units 3A and 3B and the structure and shape of the rectangular wave guide 51 are also the same. Furthermore, as shown in FIG. 4, as viewed in the plane shape (viewed from the top), the location of the rectangular wave guide 51 relative to the axial lines M1 and M2 connecting the center 4a of the mounting stage 4 and the center 22a of the width of the transfer port 22 is the same. In the plasma processing apparatus shown as a conventional example, the rectangular wave guides of both the plasma processing units are arranged symmetrically right and left and the embodiment of the present invention is different in this respect.

In FIG. 4, numeral 61 indicates a rotary and flexible transfer arm of a multi-joint type round the Z axis and is installed in the transfer chamber 2. The transfer arm 61 transfers the wafer W between a reserve vacuum chamber 62 connected to the transfer chamber 2 and the mounting stages 4 in the plasma processing units 3A and 3B. Numeral 63 indicates a transfer arm located in the atmosphere and numeral 64 indicates a turntable which is a part of the positioning unit for positioning the wafer W.

In this case, the wafer W has a positioning notch (V-shaped notch) 100 and the notch 100 functions as a reference point of the wafer W. The transfer arm 61 in the transfer chamber 2 transfers the wafer W in a state that the notch 100 of the wafer W is positioned to the transfer arm 61. When the transfer arm 61 transfers the wafer W to the mounting stage 4 of each of the plasma processing units 3A and 3B, it transfers the wafer W in a fixed transfer direction. The transfer direction of the wafer W coincides with the axial lines M1 and M2 connecting the center 4a of each of the mounting stages 4 and the center 22a of the width of each of the transfer ports 22.

The operation of positioning the notch 100 of the wafer W to the transfer arm 61 is performed by the turntable 64 and the transfer arm 63 and a positioning means is structured by the turntable 64 and the transfer arm 63.

Next, the operation of the aforementioned embodiment will be explained by referring to an example that the film forming process is to be performed. Firstly, the transfer arm 63 shown in FIG. 4 takes out the wafer W from a cassette not shown in the drawing and transfers it to the turntable 64 of the positioning unit and the wafer W is positioned here so that the direction and center are set as specified. Next, the wafer W is transferred from the transfer arm 63 to the transfer arm 61. The wafer W is transferred to, for example, the mounting stage 4 of the plasma processing unit 3A by the transfer arm 61 in a predetermined transfer direction (axial line M1) via the reserve vacuum chamber 62 and the transfer chamber 2. In this case, the wafer W, as mentioned above, is positioned beforehand by the turntable 64 and the transfer arm 63 so that the positioning notch 100 is directed to the rotational center P of the transfer arm 61. As a positioning reference part of the wafer W not only the notch but also the orientation flat may be used. Then, the gate valve 21 is closed so as to enclose the inside of the vacuum processing chamber 31, and the internal atmosphere of the vacuum processing chamber 31 is exhausted so as to evacuate down to a predetermined degree of vacuum. Then plasma generation gases such as $O_2$ gas and Ar gas are introduced into the first vacuum chamber 32 through the plasma gas nozzle 30, and also $SiH_4$ gas and $SiF_4$ gas are introduced into the second vacuum chamber 33 through the gas feed unit 34. In this case, the inter pressure is kept at a predetermined process pressure, and a microwave is introduced form the microwave generator 54, and the film forming process for the wafer W is started.

A microwave (high frequency waves) of 2.45 GHz from the microwave generator 54 is transferred in the rectangular wave guide 51 in the TE mode and the TE mode is converted to the TM mode at the connector of the rectangular wave guide 51 and the cylindrical wave guide 52. The microwave is transferred in the conical wave guide 53 as it is in the TM mode. The microwave then reaches the ceiling of the vacuum processing chamber 31, goes through the transmission window 37, and is introduced in the first vacuum chamber 32. In the vacuum chamber 32, the electric field generated by the electromagnetic coils 41 and 42 is applied. (Electric field)×(magnetic field) is induced by the mutual action of the magnetic field and microwave, and electron cyclotron resonance is generated at the ECR point, where the magnetic flux density is 875 gauss. As a result, Ar gas and $O_2$ gas are converted to plasma by the resonance and highly densed.

The plasma flow flowing from the first vacuum chamber 32 into the second vacuum chamber 33 activates $SiH_4$ gas and $SiF_4$ gas which are reactive gases fed in the second vacuum chamber 33, to form an active species, and is transferred to the wafer W. In this way, an $SiO_2$ film and an SiOF film are formed on the surface of the wafer W. The next wafer W is transferred into the plasma processing unit 3B and processed in the same way.

According to the aforementioned embodiment, the wafer W, in either of the plasma processing units 3A and 3B, is so positioned that the notch 100 of the wafer W is directed toward the rotational center of the transfer arm 61 and the wave guides 5 and 5 of the plasma processing units 3A and 3B coincide with the transfer directions (the directions of the axial lines M1 and M2) of the transfer arm 61. As a result, the location relationship of the wave guide 5 of the plasma processing unit 3A to the notch 100 of the wafer W is the same as that of the wave guide 5 of the plasma processing unit 3B to the notch 100 of the wafer W. The sectional shape and length of both the wave guides 5 are also the same. Therefore, even if the electric field intensity distribution of a microwave introduced from the wave guide 5 is deviated and the plasma concentration on the basis of it is not uniform, there is no difference in the effect of the deviation of the electric field intensity distribution for the wafer W between the plasma processing units 3A and 3B. Therefore, the analysis of the processing condition of the wafer W, for example, when the intra-surface uniformity of the film thickness is bad the clearing-up of the cause can be easily carried out and the improvement of the apparatus structure and parameters such as the shape of magnetic field can be easily adjusted.

The plane shape of the rectangular wave guide 51 is not limited to the hook shape as mentioned above and for example, it may be extended linearly. The plasma process is not limited to the film forming process and for example, it may be a process of feeding CF gas or the like from the plasma gas nozzle 30 for etching an $SiO_2$ film or a process of feeding hydrogen chloride gas for etching aluminum. Even in a case of etching, the present invention produces an effect that analysis of uneven etching and improvement of the apparatus can be performed easily.

An example that a microwave is transmitted as high frequency waves from the microwave generator 54 via the wave guide 5 is disclosed above. However, there is no limit to the above and it is also possible to use UHF waves as high frequency waves instead of a microwave and generate electron cyclotron resonance by the mutual action of the UHF waves and magnetic field.

As mentioned above, according to the present invention, in the apparatus that a plurality of plasma processing units using ECR are connected to the transfer chamber, a difference between the plasma processing units can be eliminated with respect to the processing condition for a substrate, and therefore analysis of the processing condition and improvement of the apparatus can be easily performed.

What is claimed is:

1. A plasma processing apparatus having a bent wave guide, comprising:

a plurality of plasma processing units, each having a vacuum processing chamber including a mounting stage for mounting a substrate with a fixed reference point and a wave guide bent at an angle for introducing high frequency waves into said vacuum processing chamber for converting process gas to plasma by high frequency waves and processing said substrate by said plasma; and a common transfer chamber airtightly connected to said plurality of plasma processing units and including a transfer arm adapted to transfer said substrate to said mounting stage in a transfer direction that is fixed for each of said plurality of plasma processing units, and is adapted such that said reference point of said substrate is always positioned the same with respect to said transfer arm, wherein for each of said plurality of plasma processing units, the position of said wave guide in relation to said transfer direction of said transfer arm is the same.

2. The plasma processing apparatus according to claim 1, wherein the apparatus is configured to perform a film forming process.

3. The plasma processing apparatus according to claim 1, wherein the apparatus is configured to perform an etching process.

4. The plasma processing apparatus according to claim 1, further comprising:

positioning means for positioning said reference point of said substrate to said transfer arm.

5. The plasma processing apparatus according to claim 1, wherein each of said plasma processing units is connected to said transfer chamber through a transfer port and said transfer direction of said transfer arm is on a straight line connecting the center of said mounting stage and the center of said transfer port.

6. The plasma processing apparatus according to claim 1, wherein each of said plasma processing units converts a process gas to plasma using electron cyclotron resonance by high frequency waves and an electric field.

7. The plasma processing apparatus according to claim 1, wherein said wave guide of each of said plasma processing units has the same length and the same sectional shape.

8. A plasma processing method for performing a predetermined process for a substrate by a plasma processing apparatus having a bent wave guide comprising a plurality of plasma processing units, each having a vacuum processing chamber including a mounting stage for mounting a substrate with a fixed reference point and a wave guide bent at an angle for introducing high frequency waves into said vacuum processing chamber for converting process gas to plasma by high frequency waves and processing said substrate by said plasma; and a common transfer chamber airtightly connected to said plurality of plasma processing units and including a transfer arm for transferring said substrate to said mounting stage in a transfer direction that is fixed for each of said plurality of plasma processing units, and wherein for each of said plasma processing units, the position of said wave guide in relation to said transfer direction of said transfer arm being the same, comprising the steps of:

transferring said substrate with said reference point to said mounting stages of said plasma processing units from said transfer chamber, said reference point of said substrate being positioned the same in each of said plasma processing units with respect to said wave guide, and performing a plasma process for said substrate while the position of said reference point of said substrate in relation to said wave guide is kept the same for each of said plasma processing units.

* * * * *